United States Patent [19]
Smialek et al.

[11] 3,990,832
[45] Nov. 9, 1976

[54] SWITCHING DEVICES FOR PHOTOFLASH UNIT

[75] Inventors: Robert L. Smialek, Pepper Pike; Mary S. Jaffe, Cleveland Heights, both of Ohio

[73] Assignee: General Electric Company, Schenectady, N.Y.

[22] Filed: Sept. 29, 1975

[21] Appl. No.: 617,668

Related U.S. Application Data

[63] Continuation-in-part of Ser. No. 508,105, Sept. 23, 1974, abandoned.

[52] U.S. Cl. .............................. 431/95 A; 317/80; 338/15
[51] Int. Cl.² ......................................... F21K 5/02
[58] Field of Search ............ 431/95, 97, 98; 317/80; 338/13, 15, 18

[56] References Cited
UNITED STATES PATENTS

| | | |
|---|---|---|
| 3,451,813 | 6/1969 | Kinney et al. ........................ 96/36.2 |
| 3,458,270 | 7/1969 | Ganser et al. ......................... 431/95 |
| 3,459,488 | 8/1969 | Schroder et al. ...................... 431/95 |
| 3,532,931 | 10/1970 | Cote et al. ......................... 431/95 X |

*Primary Examiner*—Edward G. Favors
*Attorney, Agent, or Firm*—John F. McDevitt; Lawrence R. Kempton; Frank L. Neuhauser

[57] ABSTRACT

A multiple flashlamp array is designed having a plurality of lamps fired individually and in sequence and includes a plurality of static solid switching devices capable of being easily activated by radiant energy generated during flashing of the lamps. Initially, the switches have a high resistance ("off" condition) and after being activated by radiation, they undergo chemical conversion to a conductive state ("on" condition). The switches are prepared from compositions which impart improved shelf life under conditions of relatively high humidity at above normal ambient temperatures.

17 Claims, 4 Drawing Figures

SWITCHING DEVICES FOR PHOTOFLASH UNIT

This is a continuation-in-part of application Ser. No. 508,105, filed Sept. 23, 1974 and now abandoned.

BACKGROUND OF THE INVENTION

The present invention is in the field of multiple photoflash lamp arrays, such as flashcubes and planar arrays, adapted to be temporarily attached to a camera and capable of producing a plurality of flashes for taking a plurality of pictures. In general, these multilamp photoflash arrays or assemblies comprise a reflector unit having a plurality of adjacent reflector cavities, each having a photoflash lamp mounted therein and are well known in the art.

The conventional flashcube is one well known embodiment of such photoflash lamp arrays and an example of a flashcube is described in the U.S. Pat. No. 3,739,166 to R. M. Anderson. Various type linear or planar photoflash lamp arrays are also well known in the art wherein a series of reflectors are arranged in one or more rows which may face in the same direction to form a single-sided array or in opposite directions to form a two-sided array. An example of such two-sided array is described in the U.S. Pat. No. 3,598,984 whereas such single-sided array is described in the U.S. Pat. application entitled "Multiple Photoflash Lamp Unit" of K. H. Weber, Ser. No. 448,671, filed Oct. 22, 1973, now U.S. Pat. No. 3,937,946, and assigned to the assignee of the present invention.

As further illustrative of the various designs and constructions that have already been proposed for multiple lamp photoflash arrays, it is known to have associated flashlamp-reflector assemblies mounted adjacent to one another in one or more rows facing in the same direction and operatively associated by electrical circuit means so that a group of the flashlamps which are relatively further from the camera lens axis than are the other lamps of the unit will be flashed. This mode of operation can be accomplished with a lamp configuration in which the individual flashlamps are electrically connected to a printed circuitboard member with electrical contact being made to the camera by contact tabs located at opposite ends of the circuitboard which readily plug into a suitable receiving socket on the camera itself or on an adaptor therefor. An electrical energy source which may be contained within the camera is connected to said contact tabs so that a firing pulse produced by the source can be applied across said contacts depending upon the type of lamps used in the flashlamp array. If low voltage filament type flashlamps are employed in the array, the firing pulse source may be of the battery or battery-capacitor discharge type producing in synchronization with opening of the camera shutter, a pulse of approximately 3 volts to 15 volts or more and of sufficient energy to fire a single flashlamp. An example of a suitable low voltage flashlamp is disclosed in U.S. Pat. No. 3,506,385 to K. H. Weber and G. W. Cressman and an example of a low voltge flash-sequencing circuit is disclosed in the U.S. Pat. No. 3,532,931 to P. T. Cote and J. D. Harnden. If the flashlamps in the multiple flash array are of the so-called high voltage type, requiring a pulse of approximately of 1,000 – 2,000 volts, the firing pulse source may comprise a suitable battery-capacitor discharge and voltage step-up transformer type circuit, or may employ a compact piezoelectric element arranged to be impacted or stressed in synchronization with opening of the camera shutter, so as to produce a firing pulse having a voltage of approximately 1,000 or 2,000 volts and of sufficient energy to fire a single flashlamp. An example of a high voltage flashlamp and a firing pulse source comprising a piezoelectric element synchronized with a camera shutter is described in U.S. Pat. Nos. 2,972,937 and 3,106,080, both to C. G. Suits.

Radiation switches which are suitable in a flash-sequencing circuit of the type above generally described are also known. These switches which can be employed in various ways are converted from a high resistance or open circuit condition upon flashing of an adjacent flashlamp in the array to provide a low resistance circuit path to another unflashed lamp. A solid static switch which operates in this manner is described and claimed in U.S. patent application, Ser. No. 460,801, abandoned, filed Apr. 15, 1974, entitled "Switching Devices for Photoflash Unit," in the names of F. F. Holub et al, and assigned to the assignee of the present invention. The described switch material composition comprises a mixture including a carbon-containing silver salt and an organic polymer binder exhibiting improved shelf life under conditions of high relative humidity especially at above normal ambient temperatures. Various modifications of such switch material composition are disclosed to include a mixture of silver oxide with a carbon-containing silver salt as the silver source which is converted to elemental silver upon lamp flashing along with incorporation of various additives to improve the desired performance. One disclosed type of additive is a radiation absorptive filler such as carbon if the silver source itself does not absorb sufficient impinging actinic radiation from the flashlamp reliably to provide a low ohmic conversion.

SUMMARY OF THE INVENTION

The present invention is based on our discovery that greater humidity resistance at above normal ambient temperatures can be imparted to a solid switch material of the above general type by incorporating in the material an organic stabilizing additive which reacts with the silver source and reduces the tendency of the source to convert to a low electrical resistance when exposed to warm water vapor. While the particular mechanism by which such improvement takes place is not fully understood at this time, it is known that certain silver sources such as silver oxide are slightly soluble in water. Water vapor at elevated temperatures probably causes partial dissolution of the silver source and most likely produces an electrochemical reaction which results in the formation of silver ions and leads to premature conversion of the silver source to elemental silver metal. The present stabilizer additive reacts readily with silver ions, and the reaction product which is formed is substantially insoluble in water and is thermally stable. It is believed that the present stabilizer additive reacts with the silver ions in solution and decreases the concentration of such ions so as to reduce the tendency of the silver source to convert to elemental silver when exposed to water vapor. Moreover, it is believed that the reaction of the present stabilizer additive with the silver ions creates a water insoluble reaction product which forms a protective film around the surfaces of the individual particles of the silver source so as to protect such particles against further attack by water vapor.

Preferred silver source materials for preparing the improved radiation switches of the present invention are essentially pure forms of silver oxide and a carbon-containing silver salt exhibiting sufficient sensitivity to conversion by the actinic radiation emitted from an adjacent flashlamp so that a mass of the converted switch material reliably provides electrical innerconnection between a pair of spaced apart electrical leads in the electrical circuit. In this regard, it has been found that when silver oxide provides the only silver source in the switch composition, there is a likelihood of failure to provide the desired innerconnection due to overly vigorous conversion or to a formation of physical cracks in the mass of switch material which can lead to an open circuit condition. The preferred switch material compositions contain a mixture of silver oxide with a suitable carbon-containing silver salt in ratios wherein the silver salt represents the major weight portion of the mixture to ameliorate the greater violence of silver oxide when undergoing conversion in this manner. The useful carbon-containing silver salts must be relatively stable under conditions of high humidity and elevated ambient temperature in order to provide a switch material which operates reliably after storage. Useful silver salts can be either organic or inorganic compounds and these include silver carbonate, silver pyruvate, silver acetylacetonate, silver acetate, silver oxalate, silver citrate, silver behenate, silver benzoate and silver fumarate.

Useful binder materials for the present stabilized radiation switch devices can be selected from the class of humidity resistant organic polymers which can be employed in the form of a liquid medium for suspension and dispersion of the particulate solids in the switch material composition. The amount of organic polymer binder is preferably about 5 – 10 weight percent based on the silver source material in the switch composition. Useful binders include the cellulose esters such as cellulose nitrate and cellulose acetate butyrate; the cellulose ethers such as ethyl cellulose and ethyl hydroxyethyl celulose; acrylates such as polymethyl methacrylate, polymethyl acrylate; polycarbonate; and polystyrene as well as styrene copolymers such as the thermoplastic block copolymer of styrene with butadiene.

Various particulate fillers can also be incorporated into the present switch material composition to improve rheological properties of the liquid coating mixture such as bodying agents or adhesion promoters as well as to improve performance of the final solid switch itself. For example, the incorporation into the liquid coating mixture of up to about 2 percent by weight of finely divided carbon particulates can improve radiation absorption of the solid switch when light colored silver source materials are used and also improve deposition of the liquid coating mixture as a paste. Dispersing agents such as non-ionic surfactants have also been found useful in preparing a liquid suspension of the switch material which can be cured or dried to provide the desired switching capability. In depositing the switches for a preferred circuitboard embodiment of the present invention wherein each switch is located between a pair of spaced apart electrical terminals on the circuitboard, conventional techniques may be used requiring an organic diluent or solvent. Useful solvents include pine oil, hydrocarbon fluids, esters, for example, an ether-ester, etc., such as admixtures of hydrocarbons with alcohols which are conventionally used in silk screening. The liquid coating mixture for deposition is formed by mixing the silver source material with the organic binder and solvent to form a slurry. This may be applied across the terminals by conventional means as a thin coating and the solvent thereafter evaporated to provide the solid switch.

Useful stabilizer additives for incorporation into the switch material compositions to inhibit moisture attack can be selected from the general class of organic compounds which react with silver ions to form an insoluble reaction product without otherwise interfering with the desired silver conversion product. Since the preferred silver oxide constituent forms a basic solution when attacked by moisture, weak organic acids have been found useful when added in small but effective amounts of about 0.1 – 2.0 weight percent of the switch material composition. By "weak organic" acids as used herein is meant a pH value less than silver oxide in aqueous suspension which exhibits a pH of 9.8. Aromatic triazole compounds selected from the group of benzotriazole and carbon substituted benzotriazoles, such as tolyl triazole have been found especially effective. Generally speaking, any organic triazole compound may be used in which the molecular structure includes a triazole ring having a hydrogen atom attached to one of the nitrogen atoms and joined to a hydrocarbon moiety.

DESCRIPTION OF THE PREFERRED EMBODIMENTS

Figure 1:
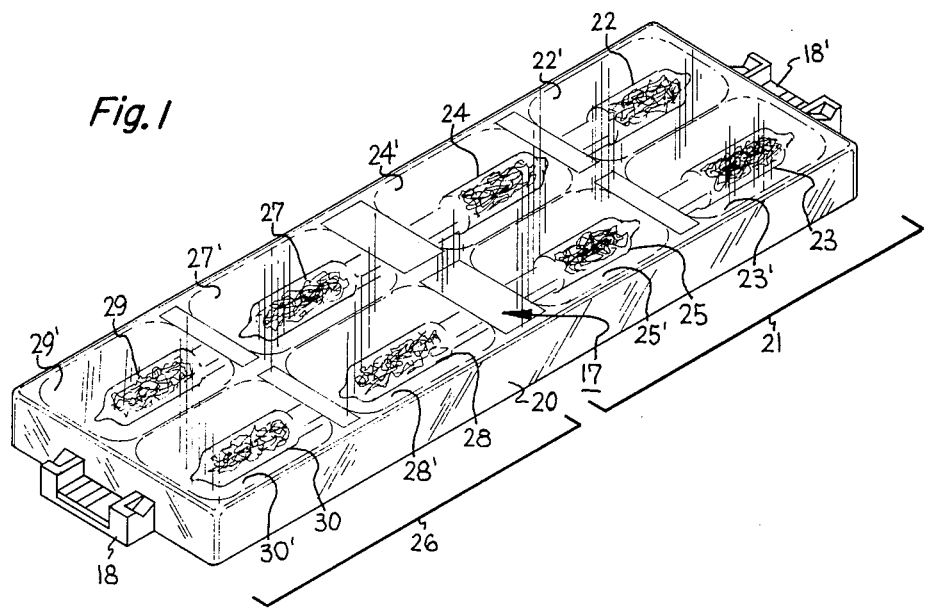
FIG. 1 is a perspective view of a multiple photoflash array according to the present invention.

Referring now to the accompanying drawings, in the preferred embodiment illustrated in FIG. 1, a multiple flashlamp unit 17 shown as being of the planar array type and containing a plurality of electrically fired flashlamps is provided with a plug-in connector tab 18 at the lower side or end thereof adapted to fit directly into a camera. The lamp array 17 is also provided with a second plug-in connector tab 18' at the top side or opposite end thereof whereby the array 17 is adapted to be attached to the camera in either of two orientations, i.e., with either the tab 18 or 18' being plugged into the camera. Upon connecting this multiple flash array to a camera in these different orientations, it becomes possible to flash a group of lamps which is relatively further from the camera lens axis than are the other lamps of the array. More particularly, the first and second connector tab means for connecting the electrical circuit to a camera provides that only a first group of flashlamps can be flashed when the first connector means is connected to the camera and that only a second group of flashlamps can be flashed when the second connector means is connected to the camera. A camera containing flash activation means (not shown) couples to a pair of electrical terminals provided on the connector means of this particular circuitboard configuration whereupon electrical conductors in the circuit path enable the appropriate lamps to be flashed as hereinafter explained in greater detail.

The array 17 is provided with an upper group 21 of flashlamps 22, 23, 24, and 25 and a lower group 26 flashlamps 27, 28, 29, and 30. Reflectors 22' – 25' and 27' – 30' are disposed behind the respective flashlamps so that as each lamp is flashed, its light is projected forwardly of the array 17. As can be seen from the drawing, the reflector unit has a plurality of outwardly facing reflectors in linear rows arranged in side-by-side relationship and facing outwardly in the same direction. The individual flashlamps are mounted within the innermost part of an associated reflector. The relationship of each reflector to its associated lamp and the arrangement of a suitable plastic housing 20 providing cover means for said array may be generally that as disclosed in the above referenced patents and patent applications. As will be seen more clearly in connection with the detailed description of the circuitboard member in FIG. 2, the four (4) lamps in the upper group 21 are connected to the lower plug-in tab 18, and the lower group 26 of lamps are connected to the upper plug-in tab 18'. It becomes thereby possible with such associated sequencing circuitry to flash the group of lamps relatively farthest from the lens axis of the camera.

Figure 2:
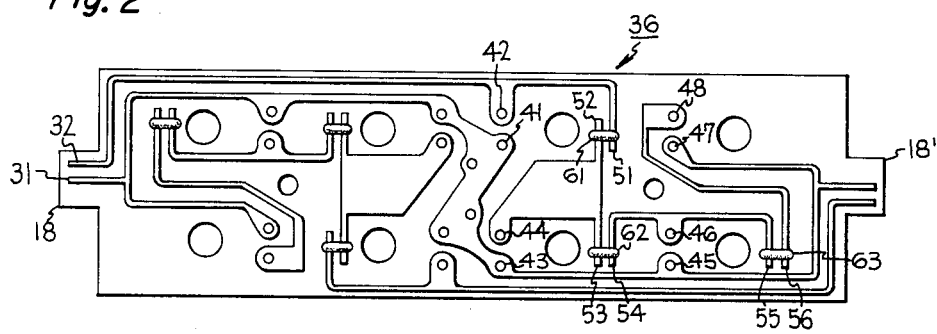
FIG. 2 is a top view of the circuitboard showing a series circuit arrangement of the associated electrical circuitry for a multiple flashlamp array as illustrated in FIG. 1 which includes the switching devices.

FIG. 2 shows a circuitboard 36 which is contained within the housing 20, said housing being in the form of a base to which light-transmitting cover means is secured to hold the entire assembly together. The circuitboard member is contained within the housing behind the reflectors 22', etc. and provides support means for the flashlamps which are secured to the board by their lead-in wires (see FIG. 3) to provide the electrical circuitry for sequential firing of each group of lamps. The plug-in connector tabs 18 and 18' may be formed integrally with the circuitboard 36 on the opposite ends thereof as shown. While an entire illustrative printed circuit is shown, only the portion of the printed circuit servicing the upper group 21 of lamps will be discussed in detail since the portion of the printed circuit servicing the lower group 26 as depicted is essentially the reverse mirror image thereof. The circuitboard 36 is considered from the point of view of being plugged into the camera (not shown) through the connector tab 18 whereby circuitboard terminals 31 and 32 make electrical contact with the flash activation means of the camera. The circuitboard terminal 31 is part of a continuous conductor run on the board which is connected to one electrical lead wire of all the flashlamps of a group and, for purposes of this description, to the four (4) flashlamps 24, 25, 23 and 22 at points 41, 43, 45 and 47, respectively, by suitable means such as soldering, welding, or crimping. The second terminal 32 is part of a conductor run that is connected to the second lead wire of lamp 24 at point 42 and terminates at radiation switch terminal 51 which is close to, but spaced apart from, radiation switch terminal 52. Similar switch terminal pairs are located at 53–54 and 55–56. The second lead wires of lamps 25, 23 and 22 are attached to points 44, 46 and 48, respectively. Radiation switches 61, 62 and 63 are respectively positioned to be in contact with and bridge across the respective pair of switch terminals at 51–52, 53–54, and 55–56. Initially, all the switches are in the "off" condition which permits only the first bulb 24 in the sequence to be fired. The firing of any flashbulb turns the switch adjacent thereto to the on condition. Operated with lamps which become open-circuited upon flashing, the described circuit embodiment employs this static type switch means to sequence the next unflashed lamp in the group by means of a parallel connection of the lamps with the switch devices being connected in series with one another. The same result could be produced with the same type flashlamps being connected in parallel with respect to one another by having each switch device connected in series with a single lamp between the branch circuits of the flashlamps.

Figure 3:
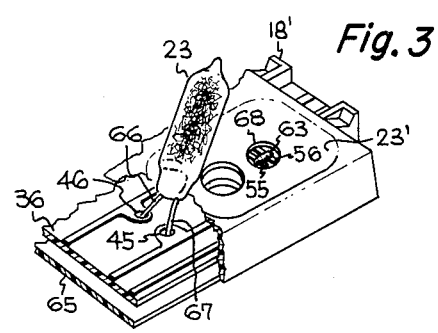
FIG. 3 is a three-dimensional broken-away view showing a single flashlamp in a slightly raised position and also showing the relationship between said lamp and the adjacent switch.

FIG. 3 illustrates a single flashlamp 23 in a slightly raised position with the transparent cover means removed to show the relative position between the lamp 23 and the switch 63 adjacent thereto below reflector 23'. The flashlamp 23 is attached to and supported by the printed circuitboard 36 through leads 66 and 67 at points 45 and 46, respectively. The switch 63 previously described in connection with FIG. 2 bridges switch terminal pair 55 and 56 and an opening 68 is provided in the reflector 23' between the bulb 23 and the switch 63 to facilitate radiation transfer.

When lamp 23 is disposed in its usual position shown in FIG. 1, a portion of the envelope of the lamp is located about 2 millimeters from the switch. As the lamp 23 is flashed, light and heat radiation is transmitted to the switch 63 and turns the switch from the off condition to the on by initiating a thermal chemical reaction.

Figure 4:
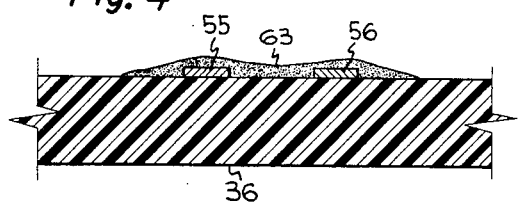
FIG. 4 is a cross-sectional view through a single switch and the connecting terminals shown in FIG. 3.

FIG. 4 shows an enlarged cross-section of the switch configuration in FIG. 3 wherein a mass of the switch material innerconnects a pair of spaced-apart electrical terminals. In this embodiment, the switch terminals 55 and 56 are mounted on the circuitboard 36. The radiation switch 63 is applied to the circuitboard 36 as a coating in electrical contact with the terminals 55 and 56. Each of the radiation switches 61, 62 and 63 upon receiving heat and/or light radiation from the adjacent lamp when it is flashed, changes from an open circuit of high resistance to a closed circuit of low resistance thereby electrically connecting the switch terminals embedded therein so as to enable flashing of the next lamp in the sequence.

In its preferred embodiments, the present stabilized switch material composition is formulated to provide the desired sensitivity of operation with existing flashlamp constructions. Accordingly, the desired conversion of silver oxide ($Ag_2O$) and/or a carbon-containing silver salt such as silver carbonate ($Ag_2CO_3$) to elemental silver takes place with accompanying combustion of the organic binder wherein at least part of the oxygen required for such combustion is obtained by chemical reduction of the silver source material. A complete reduction of the silver source material in this manner can be promoted if stoichiometric principles are applied for the proportions of silver source material and binder in the mixture. As an example of these principles, it can be seen that each $Ag_2CO_3$ or $Ag_2O$ molecule furnishes one oxygen atom for combustion of the organic binder which requires one or two oxygen atoms for each carbon atom (depending upon whether CO or $CO_2$ is the reaction product) as well as one-half an oxygen atom for each hydrogen atom in the binder. A tertiary butyl styrene polymer binder contains twelve (12) carbon atoms and sixteen (16) hydrogen aoms atoms the repeating unit which can be satisfied by proportioning $Ag_2O$ as a representative silver source in the switch material composition to satisfy these requirements in forming carbon dioxide and water. Employing these considerations for a mixture of the tertiary butyl styrene polymer binder and the $Ag_2O$ example given, the stoichiometric weight ratio is calculated to be 0.0216 grams of binder for each gram $Ag_2O$ in the solid switch composition. The calculated weight ratio for this same binder when $Ag_2CO_3$ provides the silver source material is 0.018. The above defined stoichiometric ratios can still be followed although other organic materials are present in the switch material composition by adjusting the weight fractions of the individual organic constituents so that the aggregate total adheres to the calculated ratio. It has also been found that an excess of organic material up to about twice the calculated stoichiometric ratio will not have an undue harmful effect, but that higher ratios can impart a quenching effect upon the desired complete conversion of the silver source to elemental silver.

Various examples of the preferred stabilized switch material composition in accordance with the above considerations are now given to provide further detailed illustration of the present invention.

EXAMPLE I

A coating mixture was prepared with 4.5 grams silver carbonate, 0.5 grams silver oxide, 0.1 grams of an acetylenic glycol type non-ionic surfactant, and 0.17 gram ethyl hydroxyethyl cellulose binder. Said mixture was prepared by dissolving the cellulose binder constituent in mixed organic solvents and dispersing the silver source materials therein with the surfactant. The coating mixture was in the form of a paste that was subsequently stenciled onto four polystyrene circuit boards already having printed silver conductors thereon. Eight individual switching elements were deposited on each board for electrical testing with each switch having the configuration of an approximately ⅜ inch diameter disc of 78 microns average thickness. The switch elements were then dried in conventional fashion and exhibited an electrical resistance value of approximately $1.6 \times 10^{11}$ ohms prior to further testing in the manner described below.

One board was tested for flashing sensitivity by the flashing of an adjacent high-voltage type flashlamp located approximately ½ inch from the switch surface. Two of the switches converted to an electrical resistance less than one ohm upon the flashing of a bare lamp whereas two additional switches converted to a similar resistance value when a lamp was flashed having a 50 percent light transmitting metal screen positioned between the lamp and the switch elements. The remaining switches were further tested for conversion with 36 percent and 29 percent light transmitting screen filters but did not undergo comparable conversion which indicated some limitation upon the flashing sensitivity of the particular switch material composition.

Further evaluation of the switching elements on the three remaining circuitboards was conducted to determine shelf life and stability to environmental conditions. More particularly, it has been found for commercial applications that one requirement is for the switch elements to remain operative after being exposed to conditions of 96 percent relative humidity at a temperature of 120° F for 14 days. In this procedure, a sealable glass chamber partially filled with water is heated to a temperature of 120° F and a test circuit board is placed in the chamber above the water level. The switches are thereby exposed to moisture at 96 percent relative humidity but without condensation of water on the surface of the switches. During this test, the chamber is opened at intervals and the board is removed to have the electrical resistance of the switches measured in various ways as hereinafter further described. An object of this electrical testing is to be sure that the electrical resistance does not fall below $10^8$ ohms when a 30 volts DC voltage is impressed across the individual switches with a further object being an ability to convert each switch to less than 5 ohms electrical resistance by flashing of an adjacent lamp after the switches have experienced the aforementioned humidity exposure. To determine the initial electrical resistance of the switches, two switches on each board were converted by flashing before the boards had been subjected to humidity exposure and the after flash electrical resistance found to be less than 5 ohms with most exhibiting a 1 ohm resistance. After a two-week exposure one board was flashed and all switches converted to approximately 2.8 ohms average resistance thereby demonstrating that humidity exposure had not damaged the flashing sensitivity. A second board was tested for electrical resistance after the 14-day humidity exposure by impressing the 30 volt DC voltage across the switches. Four switches on this board were found to exhibit greater than $10^8$ ohm electrical resistance, but the remaining two switches were found to only have 60 kilo-ohm and 300 kilo-ohn resistance values which are considered too low. The second board was then subjected to a high voltage pulse at the level experienced during actual circuit board operation. An oscilloscope trace indicated that four of the switches "broke down" in that an appreciable portion of the pulse was transmitted through these switches. This is another undesirable attribute since the transmitted portion of the pulse could cause double flashing wherein two lamps flash simultaneously. Two of the switches which broke down still had a resistance of greater than $10^8$ ohms after pulsing but the resistances of the other two broken down switches (i.e., the two switches having resistances of 60 kilo-ohm and 300 kilo-ohm before pulsing) were reduced even further to 3.3 kilo-ohm and 60 kilo-ohm, respectively.

The final board was subjected to a third week of humidity exposure as hereinbefore described and the switch elements subsequently flashed with all six switches converting to elemental silver having an average 1.9 ohm resistance value.

In summary, it can be said as a result of the foregoing electrical tests that a switch material composition which does not contain the present stabilizer additives can demonstrate adequate flashing sensitivity and convertibility after 14-day humidity exposure but that two switches made from this material did not maintain the desired high initial electrical resistance and that these two switches and two additional switches transmitted a portion of a high level voltage pulse.

EXAMPLE II

Following the procedure in the foregoing example, test printed circuit boards were constructed according to the present invention by depositing a disc of switch material having 86 microns average thickness and of a composition consisting of 4.5 grams silver carbonate, 0.5 grams silver oxide, 0.01 grams benzotriazole, approximately 0.1 grams of the same surfactant, and approximately 0.17 grams of the same ethyl hydroxyethyl cellulose binder. Upon removal of the mixed solvents employed in preparing said liquid dispersion, the initial electrical resistance of the switch elements was measured and found to average $8 \times 10^{12}$ ohms which is a higher electrical resistance, surprisingly, than was obtained without the present stabilizer additives. The four circuit boards fabricated with this material composition were tested in the same manner described in the previous example. It was found that the switches of the first board exhibited acceptable sensitivity and that all switches of the three boards subjected to humidity exposure performed in an improved manner. One board survived the 14-day humidity exposure by demonstrating flashing sensitivity wherein all switches converted to an average 2.4 ohms electrical resistance. All switches of a second board subjected to humidity exposure demonstrated an electrical resistance greater than $10^8$ ohms when measured by impressing a 30 volt DC voltage across the switches before a high voltage pulse had been impressed across the switches. All switches of that second board still exhibited greater than a $10^8$ ohm resistance value after the high voltage pulsing, and the oscilloscope trace indicated that none of those switches "broke down." The final board, after a third week of humidity exposure, maintained an electrical resistance before conversion greater than $10^8$ ohms.

We do not presently know with definite certainty as to exactly why the addition of benzotriazole to the switch material enables the material to retain its initial high electrical resistance for longer periods of time under conditions of high humidity. We believe, however, that an electrochemical reaction is the most probable cause for degradation of the switch material when the latter is exposed to water vapor. Since the silver oxide in the material is slightly soluble in water, the electrochemical reaction of water with silver oxide results in the formation of silver ions according to the relationship:

$$Ag^+ + e^- \rightarrow Ag \qquad (1)$$

The standard EMF, that is, the tendency for the above reaction to proceed as written is very high and is on the order of +0.80 volts. Thus, silver ions formed by dissolution of silver oxide in water are very easily plated out as electrically conductive silver metal.

The actual EMF ($E_a$) of an electrochemical reaction depends both upon the standard EMF ($E_s$) for the reaction and the activity (A) of the ions in solution according to the equation:

$$E_a = E_s - 0.059 \log A \text{ products}/A \text{ reactants} \qquad (2)$$

We believe that the benzotriazole reacts with the silver ions and reduces the concentration (and thus the activity) of the reactants in solution so as to lower $E_a$ in equation (2) and thus diminish the tendency for the silver ions to plate out as silver metal. The reaction product which is formed is silver benzotriazolate ($Ag[C_6H_4N_3]$) which is thermally stable and water insoluble. It is believed that the silver benzotriazolate most probably provides a water insoluble film around the surfaces of the individual silver oxide particles so as to inhibit further dissolution of such particles. Thus, it appears that the addition of the benzotriazole to the switch mixture not only reduces the concentration of the ions in solution but also results in the formation of a protective jacket for the particles.

EXAMPLE III

Still different preferred switch material compositions of the present invention contained varying proportions of a non-ionic type surfactant in order to desirably reduce the initial electrical resistance of the switching elements and enable the presence of the switching elements on the board to be detected by automatic testing. More particularly, it has been found that up to approximately 4 weight percent non-ionic surfactant in the mixture can reduce the initial electrical resistance without thereafter adversely affecting its performance as a switching element. The material compositions listed in tabular form below otherwise correspond to the formulation disclosed in preceding Example II except for (1) the use of 80 percent by weight silver carbonate and 20 percent by weight silver oxide, (2) a 0.005 gram substitution of the benzotriazole constituent, and (3) a variation in weight of the same surfactant previously employed.

| GRAMS SURFACTANT | INITIAL ELECTRICAL RESISTANCE |
|---|---|
| 0 | $6 \times 10^{12}$ ohms |
| 0.027 | $2 \times 10^{11}$ ohms |
| 0.05 | $10 \times 10^9$ ohms |
| 0.086 | $11 \times 10^9$ ohms |
| 0.112 | $10 \times 10^9$ ohms |
| 0.133 | $10 \times 10^8$ ohms |
| 0.150 | $9 \times 10^8$ ohms |
| 0.180 | $7 \times 10^8$ ohms |

The above variation in surfactant content illustrates that electrical resistance can be regulated significantly in this manner. The surfactant imparts a small amount of electrical conductivity to the switching elements to permit their presence to be detected by testing apparatus.

Useful non-ionic surfactants based on the weight of the organic binder in the present switch material composition include polyoxyethylenes, ethoxylated alkylphenols, ethoxylated aliphatic alcohol, carboxylic esters, carboxylic block copolymers, etc.

It will be apparent from the foregoing description that various modifications may be made in the above representative preferred embodiments without departing from the true spirit and scope of the present invention. For example, it is not essential that the switch element be deposited directly on a printed circuit board or operated only in conjunction with a planar flashlamp array which can illuminate only in a single direction. It is intended to limit the present invention, therefore, only by the scope of the following claims.

What we claim as new and desire to secure by Letters Patent of the United States is:

1. A stabilized radiation switch for a flashlamp unit and capable of changing from a high electrical resistance to a low electrical resistance when exposed to the radiation emitted from a flashlamp disposed adjacent to the switch, said switch comprising a mass of switch material adapted to be innerconnected to a pair of spaced apart electrical terminals, said switch material comprising a silver compound having a high electrical resistance, a humidity resistant organic polymer binder, and a small amount by weight of a weakly acidic organic compound which reacts with silver ions to form a water insoluble reaction product which inhibits water from substantially reducing the high electrical resistance of said silver compound.

2. A radiation switch as in claim 1 wherein the switch material contains about 0.1 – 2.0 weight percent of said organic compound.

3. A radiation switch as in claim 1 wherein the switch material further contains up to approximately 4.0 weight percent of a non-ionic surfactant.

4. A radiation switch as in claim 1 wherein the organic compound is an aromatic triazole compound selected from the group consisting of benzotriazole and carbon substituted benzotriazoles.

5. A radiation switch as in claim 2 wherein said organic compound is benzotriazole.

6. A radiation switch as in claim 1 wherein said silver compound is in the form of particles which are adhesively bonded together by said humidity resistant organic polymer binder, and said particles being coated with a water insoluble coating formed by reacting the surface layer of said particles with said organic compound.

7. A radiation switch as in claim 6 wherein the switch material contains up to approximately 4.0 weight percent of a non-ionic surfactant.

8. A radiation switch as in claim 7 wherein the organic compound is an aromatic triazole compound selected from the group of benzotriazole and carbon substituted benzotriazoles.

9. A radiation switch as in claim 7 wherein the organic compound is benzotriazole.

10. A switch convertible by radiation from a photoflash lamp from a high resistance state to a relatively low resistance state and stabilized against adverse effects from high humidity and temperature, said switch comprising a mass of material adapted to be interconnected between spaced electrical terminals, and wherein said material includes (a) a silver compound having a high electrical resistance, (b) a humidity resistant organic polymer binder, and (c) a small amount by weight of an organic compound, said organic compound having a molecular structure which includes (i) a triazole ring having a hydrogen atom attached to one of the nitrogen atoms, and (ii) a hydrocarbon moiety.

11. A radiation switch convertible by radiation from a photoflash lamp from a high resistance state to a relatively low resistance state and stabilized against adverse effects from high humidity and temperature, said switch comprising a mass of switch material innerconnected to a pair of spaced apart electrical terminals, and wherein said switch material comprises a mixture of silver oxide and a carbon-containing silver salt, a substantially water insoluble organic polymer binder, and a small amount by weight of an aromatic triazole compound selected from the group consisting of benzotriazole and carbon substituted benzotriazoles.

12. A radiation switch as in claim 11 in which said switch material contains about 0.1 – 2.0 weight of said aromatic triazole compound and in which said organic compound is benzotriazole.

13. A radiation switch as in claim 12 in which said binder consists essentially of ethyl hydroxyethyl cellulose.

14. A photoflash lamp unit comprising
  a. a pair of flashlamps
  b. an electrical circuit into which said lamps are arranged to flash individually and in sequence, and
  c. a solid state radiation energy switch device located external of the flashlamps and forming part of the electrical circuit, said switch device being located adjacent one of said flashlamps and disposed to receive radiant energy emitted by that flashlamp, said photoflash lamp unit being characterized by said switch device being a high relative humidity resistant mass of switch material innerconnected to a pair of spaced apart electrical terminals in the electrical circuit, said switch material comprising a silver compound having a high electrical resistance, a humidity resistant organic polymer binder, and a small amount by weight of a weakly acidic organic compound which reacts with silver ions to form a water-insoluble reaction product which inhibits water from substantially reducing the high electrical resistance of said silver compound.

15. The unit of claim 4 wherein the switch material contains about 0.1 – 2.0 weight percent of said organic compound.

16. The unit of claim 4 wherein the switch material further contains up to approximately 4.0 weight percent of a non-ionic surfactant.

17. The unit of claim 4 wherein the organic compound is an aromatic triazole compound selected from the group of benzotriazole and carbon substituted benzotriazoles.

* * * * *